United States Patent [19]

Foster

[11] Patent Number: 4,761,134

[45] Date of Patent: Aug. 2, 1988

[54] SILICON CARBIDE DIFFUSION FURNACE COMPONENTS WITH AN IMPERVIOUS COATING THEREON

[75] Inventor: Bryan D. Foster, Holden, Mass.

[73] Assignee: Norton Company, Worcester, Mass.

[21] Appl. No.: 31,500

[22] Filed: Mar. 30, 1987

[51] Int. Cl.$^4$ ................................................ F27D 5/00
[52] U.S. Cl. .................................... 432/253; 432/258; 432/259
[58] Field of Search .................. 432/253, 258, 259

[56] References Cited

U.S. PATENT DOCUMENTS

| | | | |
|---|---|---|---|
| 3,157,541 | 11/1964 | Heywang et al. | 148/174 |
| 3,951,587 | 4/1976 | Alliegro et al. | 432/253 |
| 4,516,897 | 5/1985 | Shider et al. | 432/253 X |
| 4,613,305 | 9/1986 | Sakurai | 432/253 |
| 4,687,185 | 8/1987 | Urano et al. | 432/253 X |

FOREIGN PATENT DOCUMENTS 52-145419  12/1977  Japan .

Primary Examiner—Edward G. Favors
Attorney, Agent, or Firm—Arthur A. Loiselle, Jr.

[57] ABSTRACT

A diffusion furnace component system is disclosed which includes a liner, process tube, paddle and boat. These various elements are made up of a matrix of sintered silicon carbide which has been infiltrated with 5 to 30% by weight of silicon metal and finally coated with an impervious film or layer of a high purity refractory material such as e.g. silicon carbide.

7 Claims, 1 Drawing Sheet

SILICON CARBIDE DIFFUSION FURNACE COMPONENTS WITH AN IMPERVIOUS COATING THEREON

TECHNICAL FIELD

The invention relates to high temperature furnaces. More particularly the invention relates to silicon carbide components for semi-conductor diffusion furnaces used to process such products as silicon wafers to make semiconductor devices.

BACKGROUND AND INFORMATION DISCLOSURE STATEMENT

The following publications are representative of the most relevant prior art known to the Applicant at the time of filing the application.

UNITED STATES PATENTS

No. 3,157,541, Nov. 17, 1964, W. Heywang et al, No. 3,951,587, Apr. 20, 1976, R. A. Alliegro et al.

FOREIGN PATENT DOCUMENTS 52-145419, Dec. 3, 1977. Japan.

In the overall manufacturing process for the production of semi-conductor devices such as diodes, transistors and integrated circuits, a critical factor is support of silicon (or other) wafers during elevated temperature operations such as oxidation, diffusion or deposition of thin layers of various materials on the surface of the wafers. A typical process step involves the oxidation of e.g. thin silicon wafers for electrical insulation, followed by etching of cavities in the surface of the oxide layer, and the deposition of the dopant e.g. boron, phosphorus, arsenic, or antimony in the cavities which result in desired properties for each microscopic area. These semi-conductor components are made separately or in an integrated circuit array. The oxidation steps and other operations to which the silicon slices are subjected, involve a rapid heat and cool cycle in furnaces at temperatures in the range of from 400° to 1350° C. This critical heat treatment generally takes place in an electrically heated wire-wound muffle furnace. The silicon slices are placed in/on quartz or silicon or silicon carbide kiln furniture which is then placed within the work tube of the muffle furnace and the silicon slices are fired through a precisely controlled time-temperature-atmosphere cycle. The protective or reactive gases are usually introduced into the necked-down end of the diffusion furnace work tube. In the elevated temperature steps of the process the silicon slices are placed on boats or plates which are supported on appropriately designed fixtures or kiln furniture. The kiln furniture and work tube or process tube as it is called, must be made of a material with excellent thermal shock resistance in order to permit rapid heating to, and rapid cooling from, temperatures in the order of 400° to 1350° C. The material of which the kiln furniture and other furnace parts is constructed must also be of high mechanical strength, have the ability to retain its shape through a large number of heating and cooling cycles, and the material must not out-gas i.e., introduce any undesirable impurities into the atmosphere of the kiln during firing operations, and the kiln furniture must not introduce any dust-like contamination. Cleanliness and control of impurities are extremely important to the achievement of the ultimate desired electrical characteristics in the semi-conductor devices.

These demanding conditions severely limit the number of materials which can successfully be used to fabricate diffusion furnace parts or components. Generally the furnace components consist of a liner, a process tube which fits into the liner and which has a necked-down end for the introduction of the desired atmosphere, a paddle (a wheeled or cantilevered) carrier upon which are placed wafer supports, and the wafer supports or boats as they are known. These parts have often been made of fused silica, however the silica components lose their mechanical strength and progressively devitrify with time at the processing temperatures involved. In addition, silica components are very susceptible to extreme distortion from the frequent heating and cooling of the material, and will not withstand frequent cleaning with hydrofluoric acid and other cleaning solutions or environments which is normally required to maintain the necessary ultra pure furnace environment. In a more recent modification of the process the liner i.e. the tube which surrounds the process tube, has been constructed of dense silicon carbide instead of the prior silica material, and used in conjunction with a silica process tube or inner tube. The silicon carbide possessed high thermal conductivity and high strength as compared to the silica. However, even the silicon carbide liners had their shortcomings. Although the structure of the material in the silicon carbide liner was dense, the liner overall was still not totally impervious to gases. Furthermore, because the structure was porous, the total surface area susceptible to contamination was very large. As a result the ultra high purity requirements of the furnace environment were never completely attained and therefore the liner had to be used in conjunction with a silica process tube.

A more recent advancement in diffusion furnace technology is that disclosed in U.S. Pat. No. 3,951,587. This diffusion furnace is made up of a liner and/or process tube, paddle, and boat which are composed of high purity sintered or recrystallized silicon carbide which has been impregnated with 5 to 30% by weight of high purity silicon metal which renders the various components of the furnace impervious to gases. Both the silicon carbide and silicon metal should preferably be as high purity as possible to avoid contamination of the wafers being processed i.e. the purity of both materials should be at least 99% pure and even more desirable, at least 99.9%.

Japanese Patent Publication No. 52-145419 teaches diffusion furnace components of the same general type as those disclosed in the aforedescribed U.S. Pat. No. 3,951,587. The two differ in that the latter provides gas impervious sintered silicon carbide diffusion furnace components by impregnating the silicon carbide shapes with high purity silicon metal while the Japanese publication accomplishes the same end by depositing on the surfaces of the components, an impervious high purity coating of silicon carbide which is applied under a vacuum at high temperature i.e. the silicon carbide coating is vapor deposited on the surfaces of the diffusion furnace components. This impervious coating of silicon carbide accomplishes the same end result as the impregnation of the silicon carbide parts with high purity silicon metal viz. it seals the porosity in the walls of the components which otherwise allows impurities to pass through the walls to the silicon wafers being treated and/or which retain contaminants from the normal acid wash to which the furnace parts are subjected to prior use.

U.S. Pat. No. 3,157,541 covers a method of depositing a dense, impervious coating of high purity silicon carbide on a silicon or silicon carbide substrate or carrier. The method, commonly referred to as chemical vapor deposition, involves reacting at high temperature silicon containing gas with a carbon containing gas to form and deposit a film of silicon carbide. It is this type of process which is utilized by Japanese Patent Publication No. 52-145419 to lay down a layer of dense silicon carbide on porous silicon carbide diffusion furnace components.

The present invention differs from the aforecited prior art in that it is a diffusion furnace components system, i.e. a liner, process tube, paddle and boat, the components being composed of sintered silicon carbide impregnated with silicon metal which are then coated with a dense, impervious coating of a refractory material such as silicon carbide.

It is a principal object of the present invention to provide diffusion furnace components viz. a liner, process tube, paddle, and boat, which possess superior oxidation and chemical resistance, thermal shock resistance, high strength, the ability to retain their shape through a large number of heating and cooling cycles, an ultra high degree of chemical purity, impermeability to gases, and which have a very low surface area, and ability to withstand severe acid cleanings.

DISCLOSURE OF THE INVENTION

The invention is a family of diffusion furnace components viz. a liner, process tube, paddle and boat, made up of high purity sintered silicon carbide initially rendered gas impervious by impregnation with 5–30% by weight of high purity silicon metal, then further protecting the components by applying thereon a coating of a high purity refractory material such as silicon carbide, silicon nitride or silicon dioxide. The term "high purity" as used herein, means at least 99% pure and preferably at least 99.9% pure.

In a diffusion furnace both a liner and process tube, along with paddle and boats, may be employed. However, if the process tube is made according to the present invention, there is no need for the normally used liner tube i.e. instead of the furnace proper consisting of an inner tube (the process tube) and an outer tube (the liner) only one tube, the process tube, is required. The liner may be eliminated because of the high degree of impermeability and purity of the process tube of the invention. To produce liners and process tubes of such a high degree of impermeability and purity, from a functional point of view, it is only necessary to apply a refractory coating to the inside surface of the liner and process tube. However, to guarantee optimum processing conditions, it is advisable to coat all surfaces of the liner and/or process tube. Of course the paddle and boats which are placed inside of the process tube should be coated on all surfaces.

The diffusion furnace components described in U.S. Pat. No. 3,951,587 are excellent products and have enjoyed commercial success for several years. However, there are wafer treating processes which require that the diffusion furnace components be washed with strong acids, like nitric and hydrofluoric acids, before they are used to process a new batch of wafers. The components of the aforementioned patent are susceptible to major damage by such acid washing which dissolves and removes the silicon impregnant which ultimately renders the silicon carbide components porous. The present invention eliminates this problem thus greatly extending the useful life of the furnace components. In the event that the refractory coating of the invention product gets chipped or spalled off, the underlying body is still the high density impervious silicon impregnated silicon carbide of U.S. Pat. No. 3,951,587, not as in the case of the diffusion furnace parts of Japanese Patent Publication No. 52-145419. In the latter case, a spalled or chipped coating will immediately expose a porous silicon carbide body.

EXAMPLE OF THE PREFERRED EMBODIMENT

In the preferred practice of the present invention a bimodal silicon carbide is used. A mixture of 50% by weight of fine silicon carbide powder having a particle size of less than 8 microns (preferably 0.1 to 8 microns), and 50% by weight of silicon carbide powder with an average particle size of from 30 to 170 microns when sintered according to the preferred teaching of the present invention, results in a recrystallized silicon carbide matrix with a bimodal grain structure. The bimodal nature of the sintered structure produces a recrystallized silicon carbide body with a modulus of rupture of at least 10,000 p.s.i. (700 kg./cm.$^2$) and a degree and character of porosity that allows reasonably easy impregnation of the structure with silicon.

The original silicon carbide powder may be all fine or all course or any mixture thereof other than the preferred 50% 0.1 to 8 microns and 50% 30 to 170 micron combination. However, if for example the powder is all of the finer size, then the shape shrinks in the sintering operation. Shrinkage may result in distortion or cracking and makes production to close tolerances difficult. On the other hand if the silicon carbide powder is substantially coarser, the porosity would be more than adequate in size, as would be the degree of continuity between the pores, but the sintered structure would have lower mechanical strength properties than when the bimodal approach is employed.

In all cases however, the silicon carbide employed must be at least 99% pure so as not to be a source of contamination of the furnace environment during the sensitive wafer processing steps.

Figure 1:
FIG. 1 is an elevated view of a process tube. A liner would have the same shape as the process tube but without the necked-down section 2 and the ball joint 4.

The recrystallized silicon carbide process tube, liner, paddle, and boat may be preformed by any known technique, the only limitations being those imposed by the complexity of shape of the particular furnace component in point. The process tube is a hollow tube with one end necked-down to a substantially smaller diameter. The configuration shown in FIG. 1 is a very preferred design having a necked-down end 2 which terminates in a ball-joint connecting means 4 which readily facilitates a gas tight connection to a source of gas or vacuum. While the process tube could obviously be formed by several ceramic forming techniques, the preferred method is slip casting. Tubes of practically any length and diameter, and any degree of complexity of shape can easily and economically be preformed by slip-casting.

Figure 2:
FIG. 2 is a top view of a wheeled paddle. A cantilevered paddle would have the same general shape but without the tapered end 12 and wheels 6.

The paddles or boat carriers 30 FIG. 2 may also be preformed by any known method. For example, the paddle may be made up of a number of individual parts bonded together such as that shown in U.S. Pat. No. 3,705,714 to R. A. Alliegro. In that patent the many parts of the paddle were first completely formed, ultimately by hot-pressing silicon nitride, and the parts assembled with the use of a refractory cement. If a paddle according to the instant invention is desired with the configuration of that shown in the referenced patent, the various parts of the paddle may e.g. first be cold pressed, heat treated to sinter the silicon carbide, impregnated with silicon and then assembled. Alternatively, if a paddle is desired having a configuration such as that shown in FIG. 2 of the present invention, a silicon carbide billet may be formed and machined to shape green or after a presinter heat treatment. The wheels 6 of FIG. 2 would be formed separately and assembled with the main body 8 of the paddle. The machining would also include cutting of depression 10 in which the wafer boats are to be placed. However, again the preferred method of forming is slip casting. Using this method the silicon carbide paddle can be cast to shape and size. Relatively light weight paddles can be made by proper designing. For example, the main body 8 of the paddle of FIG. 2 can be slip cast to the shape shown, having hollow end portions 12 and 14 and a boat carrying section 10 having the cross section shown in FIG. 3. The wheel assembly 6 must be fabricated separately and assembled with the finished paddle.

Figure 4:
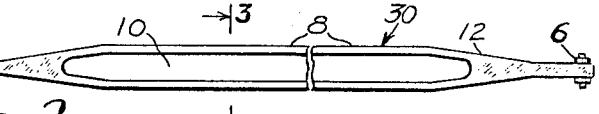
FIG. 4 is a top view of a boat.
Figure 5:
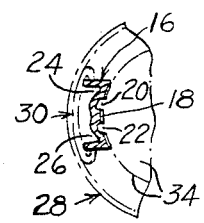
FIG. 5 is a sectional view of the boat of FIG. 4 taken at 5—5.

The boat FIG. 4, or wafer carrier, has the least complex shape of the 3 components. It may be formed by cold-pressing, isostatic pressing, extrusion, or slip casting. However, here as in the process tube and paddle, it is preferable that the boat is as light weight as strength requirements will allow, and that the cross section of the boat be such as to cover a minimum amount of the surface of the silicon wafers which are to fit in the slots in the boat. For these reasons the boat configuration shown by FIGS. 4 and 5 is highly desirable. FIG. 5 shows the overall rectangular shape of the body 16 of the boat, having a multitude of slots 18 into which the silicon wafers are to be placed. FIG. 5 shows a cross sectional view of the boat of FIG. 4. The depressions 20 and 22 in FIG. 5 are channels which traverse the length of the boat and minimize the amount of the silicon wafer which will be covered by the walls of the slots 18. The depressions 24 and 26 are for the purpose of reducing the overall weight of the boat and allowing the use of special tools for removing or inserting wafers.

Figure 6:
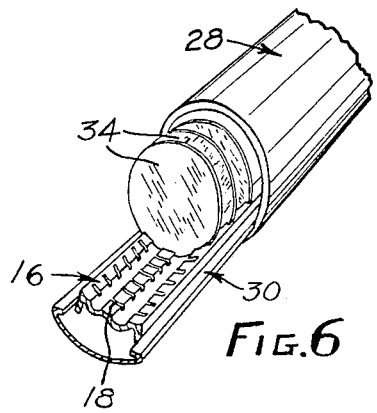
FIG. 6 is a perspective view of the partially assembled furnace components including process tube, paddle, and boat with silicon wafers positioned on the latter.

FIG. 6 shows the cooperation between the process tube 28, paddle 30, and boat 16 the latter partially loaded with silicon wafers 34 held in slots 18 in boat 32. The wheeled end (12 in FIG. 2) of the paddle 30 is resting on the bottom of process tube 28. The contoured bottom, FIG. 3, of the paddle permits optimum utilization of the volume of the process tube.

After formation of the green shapes they are then subjected to heat treatment to cause the silicon carbide particles to sinter with varying degrees of recrystallization taking place, depending on the time-temperature conditions employed. The green shapes may be treated as described in U.S. Pat. No. 2,964,823 to John I. Fredriksson. In that method, the slip is allowed to dry in the cast for 10 minutes. It is then removed from the cast and dried at 100° C. for a day, after which it is fired at 2250° C. for 10 minutes. After the green shapes are so treated, they are then subjected to a second heat treatment to introduce the silicon into the sintered silicon carbide structure, by contacting the sintered parts with silicon at a temperature of about 2150° C. in a reducing or at least a non-oxidizing atmosphere, for approximately 10 minutes. This will result in the sintered shape becoming impregnated with silicon metal in the amount of from 5 to 30 percent by weight, depending on the degree of density of the sintered shape. The silicon metal must be relatively pure i.e. at least 99% pure and preferably better than 99.9% pure silicon. The advantages of impregnating are to make an impervious structure and to increase the strength. A typical strength of the sintered silicon carbide is 13,000 to 16,000 p.s.i. in cross-bending. A CVD coating increases the strength by 10 to 20%. Impregnation by silicon doubles the strength to typical values of 30,000 p.s.i. Such a product is more rugged and better in thermal shock.

An alternative but equally effective, and sometimes more desirable, method of silicon impregnating the silicon carbide matrix is to eliminate the sintering step described above and to subject the shaped and dried green articles directly to the siliconizing (silicon impregnation) step, also as described above. In this manner, the silicon carbide particles are sintered and the matrix infiltrated, all in one step. Whether this approach is used, or the former, the porous silicon carbide shapes may be treated with the silicon by immersion, by placing the shapes in contact with silicon allowing capillarity and/or gravity to facilitate impregnation, or by exposing the shaped articles to silicon vapor at about 2150° C. In any case, at least partial silicon impregnation must occur on at least that surface of the furnace component that is to be exposed to the environment within the furnace. The paddle and boat must be impregnated completely or partially impregnated on all surfaces. The process tube and liner need only be impregnated on or into the inner surface of the tube. Obviously, for optimum performance of these furnace components, it is most desirable to fully impregnate all of the parts.

The silicon impregnated sintered silicon carbide components are then coated with a layer of a refractory. The thickness of the layer is not important but it should be dense and impervious. Any of the known methods for applying dense, impervious refractory coatings may be used but chemical vapor deposition is preferred.

EXAMPLE

A cooperating set of diffusion furnace components i.e. process tube, paddle and boat, were fabricated as follows:

A casting slip was prepared from the following combination of materials:

| | |
|---|---|
| 0.1–8 micron silicon carbide | 117 lbs. (53.2 kg.) |
| 30–170 micron silicon carbide | 108 lbs. (49 kg.) |

| | |
|---|---|
| "N" Brand sodium silicate (Philadelphia Quartz Co.) | 78 cc. |
| tap water | 13.1 liters |

The mixture was tumbled in plastic milling jars with 1 in. (2.54 cm.) diameter rubber balls for 16 hours. A portion of the slip was poured into a plaster of paris mold having a cylindrical cavity measuring approximately 80 inches (203 cm.) in length and 4.5 inches (11.4 cm.) in diameter, with a necked-down end terminating in a cavity corresponding to the outer dimensions of a 25/15 ball joint. The cavity was the shape of the process tube shown in FIG. 1. Additional slip was added periodically until the wall thickness of the casting had reached approximately 0.188 inch (0.47 cm.). The excess slip was poured out and the casting allowed to dry in the mold for about 10 minutes. The casting was then removed from the mold and further dried at room temperature for 24 hours. Approximately 7.5 pounds (3.39 kg.) of high purity silicon were evenly distributed on the bottom of the green tube and in the necked-down portion thereof. A half circle barrier was cemented to the open end of the tube and sheets of graphite felt were taped to the underside. The tube was placed in a furnace and heated to about 2150° C. in a nitrogen atmosphere, and held at that temperature for a 5 minute soak. The tube was essentially fully impregnated with silicon.

Figure 3:
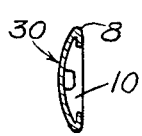
FIG. 3 is a sectional view of FIG. 2 taken through 3—3.

A paddle having the geometry of that shown in FIGS. 2 and 3 was fabricated in essentially the same manner. The paddle measured 54 inches (137 cm.) in length, having depression 10 of FIG. 2 measuring 21 inches (53.4 cm.) in length, 1.75 inches (4.45 cm.) in width, and 0.5 inch (1.27 cm.) deep, and end portions 12 and 14 of FIG. 2 measuring 0.75×0.5 inch (1.91×1.27 cm.). The wheel and axle were formed the same way but did need minor machining to maximize fit.

Similarly a boat was formed which had the configuration shown in FIGS. 4 and 5 and which measured 20.5 inches (52.1 cm.) in length, 1.6 inches (4.07 cm.) in width, and 0.5 inch (1.27 cm.) in thickness. Slots, numbering 125, were cut in the upper surface of the boat.

The process tube, paddle and boat were then coated on all surfaces with a coating of very dense, high purity (at least 99.9% pure) silicon carbide; the coating was about 0.1 mm thick. The coating method used was the well known chemical vapor deposition process utilizing a hot-wall furnace and methyltrichlorosilane as the silicon carbide producing reactant.

What is claimed is:

1. A diffusion furnace component system comprising a liner, process tube, paddle, and at least one boat supportable on said paddle wherein said liner, process tube, paddle, and boat consist essentially of a sintered silicon carbide matrix containing 5 to 30% by weight of silicon metal, at least one surface of said liner, process tube, paddle, and boat being coated with an impervious coating of a high purity refractory material.

2. The diffusion furnace component system of claim 1 wherein said impervious coating on said liner, process tube, paddle and boat is one selected from the group consisting of silicon carbide, silicon dioxide, silicon nitride, and combinations thereof.

3. The liner, process tube, paddle, and boat of claim 2 wherein said silicon carbide in the sintered silicon carbide matrix is bimodal and results from the sintering of silicon carbide powder that is made up of about 50% by weight of silicon carbide having an average particle size of 0.1 to 8 microns, and 50% by weight of silicon carbide having an average particle size of from 30 to 170 microns, and said silicon metal is at least 99% pure.

4. In a semi-conductor diffusion furnace, a liner consisting essentially of a sintered silicon carbide matrix impregnated with 5 to 30% by weight of silicon metal and wherein at least the inner surface of said liner is coated with an impervious coating of a high purity refractory material selected from the group consisting of silicon carbide, silicon dioxide, silicon nitride, and combinations thereof.

5. In a semi-conductor diffusion furnace, a process tube consisting essentially of a sintered silicon carbide matrix impregnated with 5 to 30% by weight of silicon metal and wherein at least the inner surface of said process tube is coated with an impervious coating of a high purity refractory material selected from the group consisting of silicon carbide, silicon dioxide, silicon nitride, and combinations thereof.

6. In a semi-conductor diffusion furnace, a paddle consisting essentially of a sintered silicon carbide matrix impregnated with 5 to 30% by weight of silicon metal and wherein all surfaces that enter the process tube are coated with an impervious coating of a high purity refractory material selected from the group consisting of silicon carbide, silicon dioxide, silicon nitride, and combinations thereof.

7. In a semi-conductor diffusion furnace, a boat consisting essentially of a sintered silicon carbide matrix impregnated with 5 to 30% by weight of silicon metal and wherein all surfaces of said boat are coated with an impervious coating of a high purity refractory material selected from the group consisting of silicon carbide, silicon dioxide, silicon nitride, and combinations thereof.

* * * * *

REEXAMINATION CERTIFICATE (2132nd)
United States Patent [19]
Foster

[11] B1 4,761,134
[45] Certificate Issued  Nov. 16, 1993

[54] SILICON CARBIDE DIFFUSION FURNACE COMPONENTS WITH AN IMPERVIOUS COATING THEREON

[75] Inventor: Bryan D. Foster, Holden, Mass.

[73] Assignee: Norton Company, Worcester, Mass.

Reexamination Request:
  No. 90/002,856, Oct. 9, 1992

Reexamination Certificate for:
  Patent No.: 4,761,134
  Issued: Aug. 2, 1988
  Appl. No.: 31,500
  Filed: Mar. 30, 1987

[51] Int. Cl.$^5$ ............................................. F27D 5/00
[52] U.S. Cl. .................................... 432/253; 432/258; 432/259
[58] Field of Search ............... 432/253, 258, 259; 118/500

[56] References Cited
U.S. PATENT DOCUMENTS

| | | | |
|---|---|---|---|
| 3,951,587 | 4/2076 | Alliegro et al. | 432/253 |
| 4,587,928 | 5/1986 | Yonezawa et al. | 118/500 |

FOREIGN PATENT DOCUMENTS

| | | |
|---|---|---|
| 54-90968 | 7/1979 | Japan . |
| 54-90972 | 7/1979 | Japan . |
| 61-213374 | 9/1986 | Japan . |
| 1571306 | 7/1980 | United Kingdom . |

Primary Examiner—Edward G. Favors

[57] ABSTRACT

A diffusion furnace component system is disclosed which includes a liner, process tube, paddle and boat. These various elements are made up of a matrix of sintered silicon carbide which has been infiltrated with 5 to 30% by weight of silicon metal and finally coated with an impervious film or layer of a high purity refractory material such as e.g. silicon carbide.

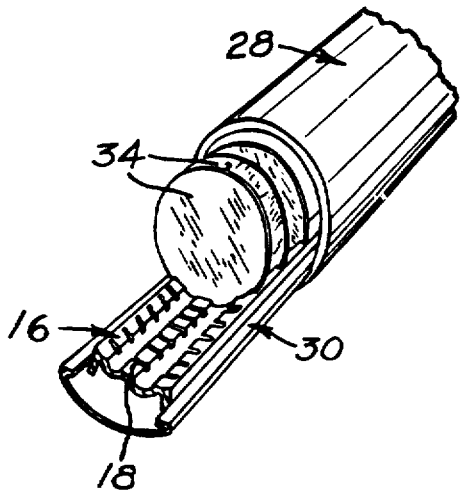

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-7 are cancelled.

* * * * *